United States Patent
Lee et al.

(10) Patent No.: US 8,697,340 B2
(45) Date of Patent: Apr. 15, 2014

(54) SEMICONDUCTOR STRUCTURE AND METHOD OF FABRICATING THE SAME

(75) Inventors: Hong-Ji Lee, Hsinchu (TW); Shih-Ping Hong, Hsinchu (TW); Fang-Hao Hsu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 1150 days.

(21) Appl. No.: 12/345,305

(22) Filed: Dec. 29, 2008

(65) Prior Publication Data

US 2010/0167021 A1    Jul. 1, 2010

(51) Int. Cl.
  *G03F 7/20* (2006.01)
(52) U.S. Cl.
  USPC .......................................... 430/313
(58) Field of Classification Search
  USPC ......................................... 430/311, 313, 394
  See application file for complete search history.

(56) References Cited

U.S. PATENT DOCUMENTS

| | | | |
|---|---|---|---|
| 2005/0239002 A1* | 10/2005 | Li | 430/316 |
| 2007/0020565 A1* | 1/2007 | Koh et al. | 430/313 |
| 2007/0298333 A1* | 12/2007 | Piumi et al. | 430/5 |
| 2010/0093175 A1* | 4/2010 | Niroomand et al. | 438/694 |

* cited by examiner

*Primary Examiner* — Brittany Raymond
(74) *Attorney, Agent, or Firm* — J.C. Patents

(57) ABSTRACT

A method of forming a semiconductor structure is provided. First, a target layer and a mask layer are sequentially formed on a substrate. Thereafter, a first pattern transfer layer having a plurality of openings is formed on the mask layer. Afterwards, a second pattern transfer layer is formed in the openings of the first pattern transfer layer. The mask layer is then patterned, using the first pattern transfer layer and the second pattern transfer layer as a mask, so as to form a patterned mask layer. Further, the target layer is patterned using the patterned mask layer.

18 Claims, 4 Drawing Sheets

SEMICONDUCTOR STRUCTURE AND METHOD OF FABRICATING THE SAME

BACKGROUND OF THE INVENTION

1. Field of Invention

The present invention relates to a semiconductor structure and a method of forming the same.

2. Description of Related Art

As the level of integration of a semiconductor device, such as a memory device, is getting higher, the dimension of the same is getting smaller. In the photolithography process, it is known that raising a line or space resolution beyond 65 nm, especially a line/space width of less than 50/50 nm, in the current state of technology is rather difficult, unless a light source having a shorter wavelength and a corresponding photoresist are used. However, it is very costly to replace existing machines entirely with new machines for this purpose.

Accordingly, how to reduce a line/space width to less than 50 nm/50 nm with existing machines and processes has become an important topic in the industry.

SUMMARY OF THE INVENTION

The present invention provides a method of forming a semiconductor device, with which the purpose of reducing a line/space width to less than 50 nm/50 nm is easily achieved.

The present invention also provides a method of forming a semiconductor device, with which the critical dimension beyond the photolithography resolution is easily fabricated by the existing machines and processes.

The present invention further provides a semiconductor device in which a line/space width of less than 50 nm/50 nm is fabricated without replacing the existing machines, so that the cost is greatly reduced and the competitiveness is significantly improved.

The present invention provides a method of forming a semiconductor structure. First, forming a target layer on a substrate. Thereafter, a mask layer and a first pattern transfer layer are sequentially formed on the target layer, wherein the first pattern transfer layer having a plurality of openings. Afterwards, a second pattern transfer layer is formed in the openings of the first pattern transfer layer. Further, the mask layer is patterned, using the first pattern transfer layer and the second pattern transfer layer as a mask, so as to form a patterned mask layer. Thereafter, the target layer is patterned using the patterned mask layer.

According to an embodiment of the present invention, the mask layer includes a first mask layer and a second mask layer sequentially formed on the target layer.

According to an embodiment of the present invention, the etch selectivity of the first mask layer to the second mask layer is greater than about 10, for example.

According to an embodiment of the present invention, the etch selectivity of the second mask layer to the first pattern transfer layer is greater than about 5, for example.

According to an embodiment of the present invention, the etch selectivity of the target layer to the first mask layer is greater than about 3, for example.

According to an embodiment of the present invention, the method of forming the first pattern transfer layer on the mask layer includes the following steps. First, a third mask layer is formed on the second mask layer. Thereafter, a bottom anti-reflection coating (BARC) layer and a patterned photoresist layer are sequentially formed on the third mask layer. Afterwards, the BARC layer and the third mask layer are sequentially patterned, using the patterned photoresist layer as a mask, so as to form the first pattern transfer layer. Further, the BARC layer and the patterned photoresist layer are removed.

According to an embodiment of the present invention, the method of forming the first pattern transfer layer on the second mask layer further includes performing a trimming process to the patterned photoresist layer before the step of sequentially patterning the BARC layer and the third mask layer, so as to reduce the line width of the patterned photoresist layer.

According to an embodiment of the present invention, the step of patterning the mask layer includes the following steps. First, the second mask layer is patterned, using the first pattern transfer layer and the second pattern transfer layer as a mask, so as to form a patterned second mask layer. Thereafter, the first mask layer is patterned, using the patterned second mask layer as a mask, so as to form a patterned first mask layer.

According to an embodiment of the present invention, the first mask layer includes silicon oxide, silicon nitride or silicon oxynitride, the second mask layer includes titanium, titanium nitride, tantalum, tantalum nitride or polysilicon, and the first pattern transfer layer includes silicon oxide, silicon nitride or silicon oxynitride, for example.

According to an embodiment of the present invention, the first mask layer includes amorphous carbon, the second mask layer includes silicon nitride, and the first pattern transfer layer includes polysilicon or silicon oxide, for example.

According to an embodiment of the present invention, the first mask layer includes amorphous carbon, the second mask layer includes polysilicon, and the first pattern transfer layer includes silicon oxide, silicon nitride or silicon oxynitride, for example.

According to an embodiment of the present invention, the thickness of the first mask layer is about 1000-2500 angstroms, the thickness of the second mask layer is about 150-500 angstroms, and the thickness of the first pattern transfer layer is about 150-400 angstroms, for example.

According to an embodiment of the present invention, the method of forming the second pattern transfer layer in the openings of the first pattern transfer layer includes the following steps. First, a BARC layer is formed to cover the first pattern transfer layer. Thereafter, a patterned photoresist layer is formed on the BARC layer, wherein the patterns of the patterned photoresist layer and the patterns of the first pattern transfer layer are alternately arranged. Afterwards, the BARC layer is patterned, using the patterned photoresist layer as a mask, so as to form the second pattern transfer layer.

According to an embodiment of the present invention, the method of forming the second pattern transfer layer in the openings of the first pattern transfer layer further includes performing a trimming process to the patterned photoresist layer before the step of patterning the BARC layer, so as to reduce the line width of the patterned photoresist layer.

According to an embodiment of the present invention, the target layer is a conductive layer, for example.

According to an embodiment of the present invention, the target layer includes aluminum, tungsten, titanium, titanium nitride, polysilicon, polycide or metal salicide, for example.

According to an embodiment of the present invention, the mask layer includes a lower part and an upper part.

According to an embodiment of the present invention, the etch selectivity of the lower part to the upper part is greater than about 10, for example.

According to an embodiment of the present invention, the etch selectivity of the upper part to the first pattern transfer layer is greater than about 5, for example.

According to an embodiment of the present invention, the etch selectivity of the target layer to the lower part is greater than about 3, for example.

The present invention also provides a method of forming a semiconductor structure. First, a substrate having a target layer thereon is provided. Thereafter, a first mask layer, a second mask layer and a first pattern transfer layer are sequentially formed on the target layer, wherein the first pattern transfer layer having a plurality of patterns and a plurality of openings. Afterwards, a second pattern transfer layer is formed in the openings of the pattern transferring layer. Further, the second mask layer is patterned, using the first pattern transfer layer and the second pattern transfer layer as a mask, so as to form a patterned second mask layer, wherein the first etch selectivity of the second mask layer to the first pattern transfer layer is greater than about 5, for example. Then, the first mask layer is patterned, using the patterned second mask layer as a mask, so as to form a patterned first mask layer, wherein the second etch selectivity of the first mask layer to the patterned second mask layer is greater than about 10, for example. Thereafter, the target layer is patterned using the patterned first mask layer, wherein the third etch selectivity of the target layer to the patterned first mask layer is greater than about 3, for example.

According to an embodiment of the present invention, the method of forming the first pattern transfer layer on the second mask layer includes the following steps. First, a third mask layer is formed on the second mask layer. Thereafter, a BARC layer and a patterned photoresist layer are sequentially formed on the third mask layer. Afterwards, the BARC layer and the third mask layer are sequentially patterned, using the patterned photoresist layer as a mask, so as to form the first pattern transfer layer. Further, the BARC layer and the patterned photoresist layer are removed.

According to an embodiment of the present invention, the method of forming the first pattern transfer layer on the second mask layer further includes performing a trimming process to the patterned photoresist layer before the step of sequentially patterning the BARC layer and the third mask layer, so as to reduce the line width of the patterned photoresist layer.

According to an embodiment of the present invention, the method of forming the second pattern transfer layer in the openings of the first pattern transfer layer includes the following steps. First, a BARC layer is formed to cover the first pattern transfer layer. Thereafter, a patterned photoresist layer is formed on the BARC layer, wherein the patterns of the patterned photoresist layer and the patterns of the first pattern transfer layer are alternately arranged. Afterwards, the BARC layer is patterned, using the patterned photoresist layer as a mask, so as to form the second pattern transfer layer.

According to an embodiment of the present invention, the method of forming the second pattern transfer layer in the openings of the first pattern transfer layer further includes performing a trimming process to the patterned photoresist layer before the step of patterning the BARC layer, so as to reduce the line width of the patterned photoresist layer.

According to an embodiment of the present invention, the first mask layer includes silicon oxide, silicon nitride or silicon oxynitride, the second mask layer includes titanium, titanium nitride, tantalum, tantalum nitride or polysilicon, and the first pattern transfer layer includes silicon oxide, silicon nitride or silicon oxynitride, for example.

According to an embodiment of the present invention, the first mask layer includes amorphous carbon, the second mask layer includes silicon nitride, and the first pattern transfer layer includes polysilicon or silicon oxide, for example.

According to an embodiment of the present invention, the first mask layer includes amorphous carbon, the second mask layer includes polysilicon, and the first pattern transfer layer includes silicon oxide, silicon nitride or silicon oxynitride, for example.

According to an embodiment of the present invention, the target layer is a conductive layer, for example.

According to an embodiment of the present invention, the target layer includes aluminum, tungsten, titanium, titanium nitride, polysilicon, polycide or metal salicide, for example.

The present invention further provides a semiconductor device including a substrate and a patterned target layer. The patterned target layer is disposed on the substrate. The patterned target layer has a plurality of patterns and a plurality of openings between the patterns, the width of each of the patterns is less than 50 angstroms, and the width of each of the openings is less than 50 angstroms.

According to an embodiment of the present invention, the target layer is a conductive layer, for example.

According to an embodiment of the present invention, the target layer includes aluminum, tungsten, titanium, titanium nitride, polysilicon, polycide or metal salicide, for example.

In the present invention, two times of a photolithography process with a certain pattern density and multiple pattern transfer processes with different hard masks are performed, so that the patterned target layer with the double pattern density is fabricated, and the purpose of reducing a line/space width to less than 50 nm/50 nm is achieved. Further, in the present invention, the critical dimension beyond the photolithography resolution can be easily fabricated with the existing machines and processes, so that the cost is greatly reduced and the competitiveness is significantly improved.

In order to make the aforementioned and other objects, features and advantages of the present invention comprehensible, a preferred embodiment accompanied with figures is described in detail below.

DESCRIPTION OF EMBODIMENTS

FIGS. 1A to 1G are schematic cross-sectional views illustrating a method of fabricating a semiconductor structure according to an embodiment of the present invention.

Figure 1A:
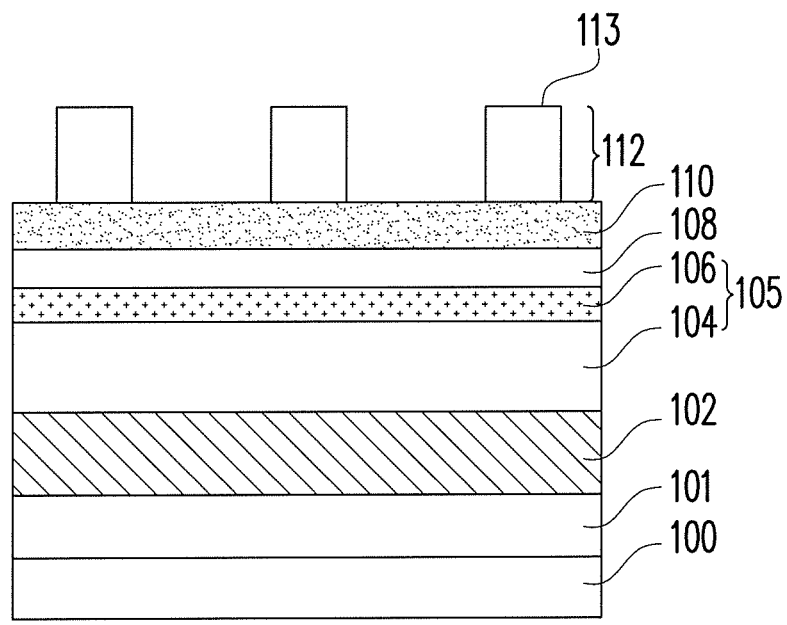
FIGS. 1A to 1G are schematic cross-sectional views illustrating a method of fabricating a semiconductor structure according to an embodiment of the present invention.

Referring to FIG. 1A, forming a target layer 102 on a substrate 100. The substrate 100 may be semiconductor substrate, such as a silicon substrate. The target layer 102 is a conductive layer including aluminum (Al), tungsten (W), titanium (Ti), titanium nitride (TiN), polysilicon, polycide or metal salicide, for example. In addition, a dielectric layer 101 can be formed before the step of forming the target layer 102. The dielectric layer 101 includes silicon oxide ($SiO_2$), for example.

Thereafter, a mask layer 105 and a third mask 108 are sequentially formed on the target layer 102. The mask layer 105 includes a lower part and an upper part. For example, the lower part may be a first mask layer 104, and the upper part may be a second mask layer 106, for example. The thickness of the first mask layer 104 is about 1000-2500 angstroms, the thickness of the second mask layer 106 is about 150-500 angstroms, and the thickness of the third mask layer 108 is about 150-400 angstroms. In an embodiment, the first mask layer includes silicon oxide, silicon nitride (SiN) or silicon oxynitride, the second mask layer includes titanium (Ti), titanium nitride (TiN), tantalum (Ta), tantalum nitride (TaN) or polysilicon, and the third mask includes silicon oxide, silicon nitride or silicon oxynitride (SiON), for example. In another embodiment, the first mask layer includes amorphous carbon (a-C), the second mask layer includes silicon nitride, and the third mask layer includes polysilicon or silicon oxide, for example. In yet another embodiment, the first mask layer includes amorphous carbon, the second mask layer includes polysilicon, and the third mask layer includes silicon oxide, silicon nitride or silicon oxynitride, for example.

Afterwards, a bottom anti-reflection coating (BARC) layer 110 and a patterned photoresist layer 112 are sequentially formed on the third mask layer 108. The BARC layer 110 can provide a planar surface for coating the photoresist layer, so as to allow the photoresist layer to have precise exposure and development. The BARC layer 110 includes an organic material, for example. The patterned photoresist layer 112 has a plurality of patterns 113 with a line width of about 100 nm.

Figure 1B:
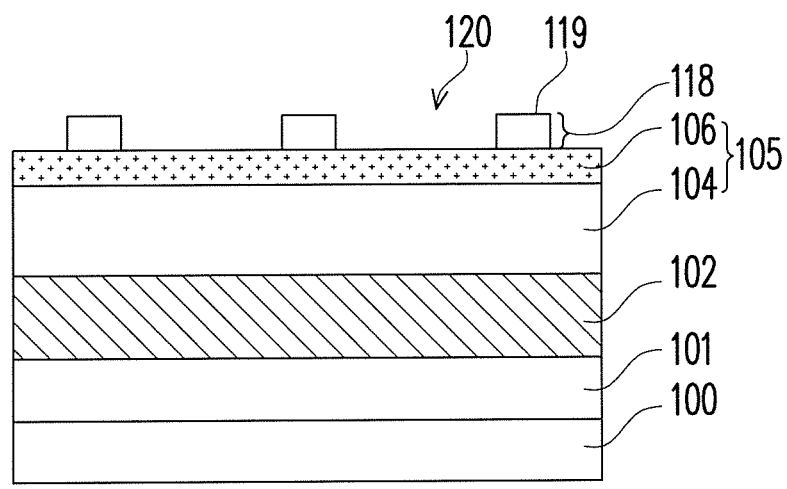

Referring to FIG. 1B, the BARC layer 110 and the third mask layer 108 are sequentially patterned, using the patterned photoresist layer 112 as a mask, so as to form the first pattern transfer layer 118 having a plurality of patterns 119 and openings 120. The method of patterning the BARC layer 110 and the third mask layer 108 includes performing an etching process, such as a dry etching process first and followed by a wet-stripping process, for example. Before the patterning process of the BARC layer 110 and the third mask layer 108, a $Cl_2$ trimming process can be performed to the patterned photoresist layer 112, so as to reduce the line width from about 100 nm to 60 nm, and thus, the first pattern transfer layer 118 have a line width of about 60 nm. In an embodiment, the third mask layer is a silicon oxide layer with a thickness of about 300 angstroms, for example. The parameters of the dry etching process include a pressure of about 5-25 mT, a top plate power of about 350-1000 W, a bottom plate power of about 40-120 W, a Ar flow rate of about 30-100 sccm, a $N_2$ flow rate of about 0-15 sccm, a $CHF_3$ flow rate of about 10-20 sccm and a period of about 25-35 seconds. Thereafter, the BARC layer 110 and the patterned photoresist layer 112 are removed by the wet etching process.

In short, as shown in FIGS. 1A to 1B, the target layer 102 and the mask layer 105 are sequentially formed on the substrate 100, and the first pattern transfer layer 118 having a plurality of patterns 119 and openings 120 is formed on the mask layer 105.

Figure 1C:
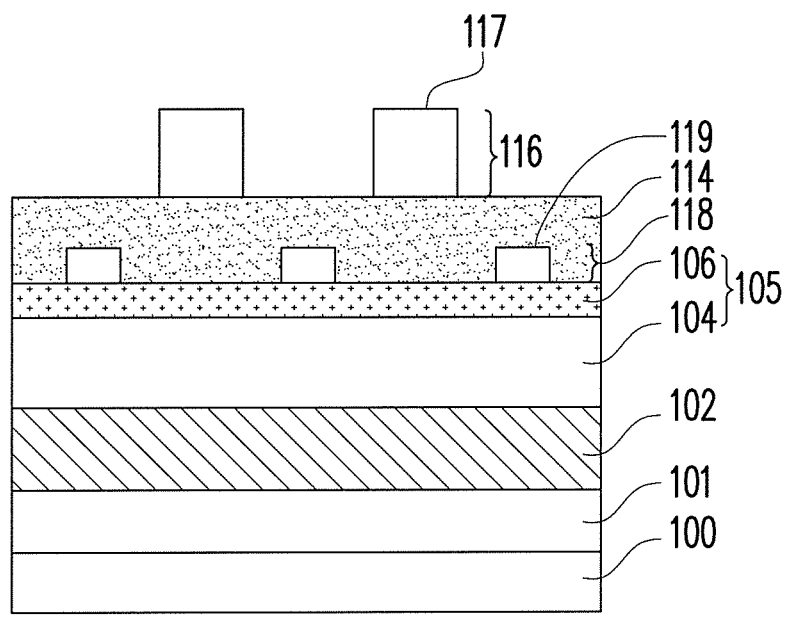

Referring to FIG. 1C, a BARC layer 114 is formed to cover the first pattern transfer layer 118. The thickness of the BARC layer 114 is about 850 angstroms, for example. Thereafter, a patterned photoresist layer 116 is formed on the BARC layer 114. The patterned photoresist layer 116 has a plurality of patterns 117 with a line width of about 100 nm. The patterns 117 of the patterned photoresist layer 116 and the patterns 119 of the first pattern transfer layer 118 are alternately arranged. In other words, the patterns 117 of the photoresist layer 116 are formed on the BARC layer 114 between the patterns 119 of the first pattern transfer layer 118.

Figure 1D:
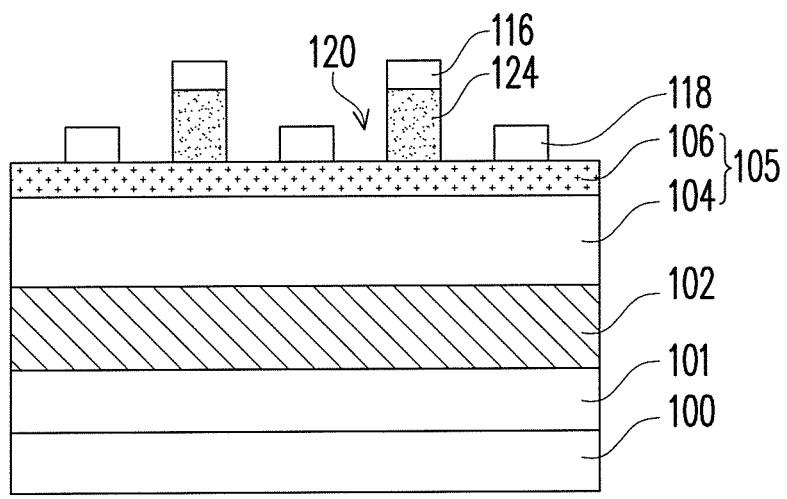

Referring to FIG. 1D, the BARC layer 114 is patterned, using the patterned photoresist layer 116 as a mask, so as to form a second pattern transfer layer 124 in the openings 120 of the first pattern transfer layer 118. Before the patterning process of the BARC layer 114, a trimming process can be performed to the patterned photoresist layer 116, so as to reduce the line width from about 100 nm to 60 nm, and thus, the second pattern transfer layer 124 have a line width of about 60 nm. Accordingly, the patterns of the first pattern transfer layer 118 and the patterns of the second pattern transfer layer 124 are alternately arranged and form a line/space width of about 60 nm/60 nm.

In short, as shown in FIGS. 1C and 1D, the second pattern transfer layer 124 is formed in the openings 120 of the first pattern transfer layer 118.

Figure 1E:
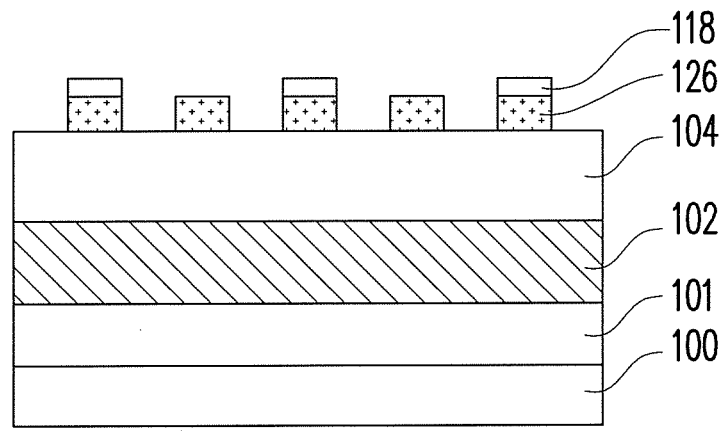

Referring to FIG. 1E, the second mask layer 106 is patterned, using the first pattern transfer layer 118 and the second pattern transfer layer 124 as a mask, so as to form a patterned second mask layer 126 with a line/space width of about 50 nm/50 nm. The method of patterning the second mask layer 106 includes performing an etching process, such as a dry etching process first and followed by a wet stripping process, for example. In an embodiment, the second mask layer 106 is a titanium nitride layer with a thickness of about 300 angstroms, for example. The parameters of the dry etching process include a pressure of about 5-20 mT, a top plate power of about 300-800 W, a bottom plate power of about 20-60 W, a $Cl_2$ flow rate of about 50-100 sccm, an Ar flow rate of about 0-50 sccm and a period of about 40-55 seconds. The etching selectivity of the second mask layer 106 to the first pattern transfer layer 118 is greater than 5, for example. In an embodiment, the etching selectivity of the second mask layer 106 (such as titanium nitride layer) to the first pattern transfer layer 118 (such as a silicon oxide layer) is about 6. Thereafter, the second pattern transfer layer 124 and the patterned photoresist layer 116 are removed by the wet stripping process. It is noted that the process step in FIG. 1D and the process step in FIG. 1E can be in-situ processes in the same process chamber.

Figure 1F:
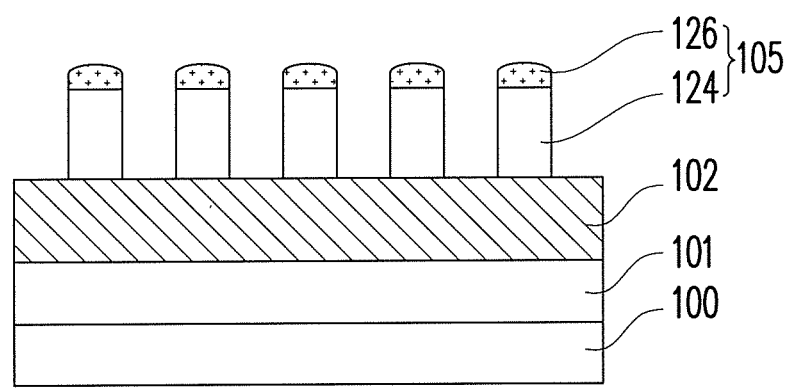

Referring to FIG. 1F, the first mask layer 104 is patterned, using the patterned second mask layer 126 as a mask, so as to form a patterned first mask layer 124 with a line/space width of about 50 nm/50 nm. The method of patterning the first mask layer 104 includes performing an etching process such as a dry etching process, for example. In an embodiment, the first mask layer 104 is a silicon oxide layer with a thickness of about 1400 angstroms, for example. The parameters of the dry etching process include a pressure of about 100-200 mT, a top plate power of about 100-350 W, a $CF_4$ flow rate of about 20-50 sccm, a $CHF_3$ flow rate of about 30-50 sccm, an $O_2$ flow rate of about 0-20 sccm, an Ar flow rate of about 0-300 sccm and a period of about 90-130 seconds. The etching selectivity of the first mask layer 104 to the patterned second mask layer 126 is greater than 10, for example. In an embodiment, the etching selectivity of the first mask layer 104 (such as a silicon oxide layer) to the patterned second mask layer 126 (such as titanium nitride layer) is about 15.

In short, as shown in FIGS. 1E and 1F, the mask layer 105 is patterned, using the first pattern transfer layer 118 and the second pattern transfer layer 124 as a mask, so as to form the patterned mask layer including the patterned first mask layer 124 and the patterned second mask layer 126.

Figure 1G:
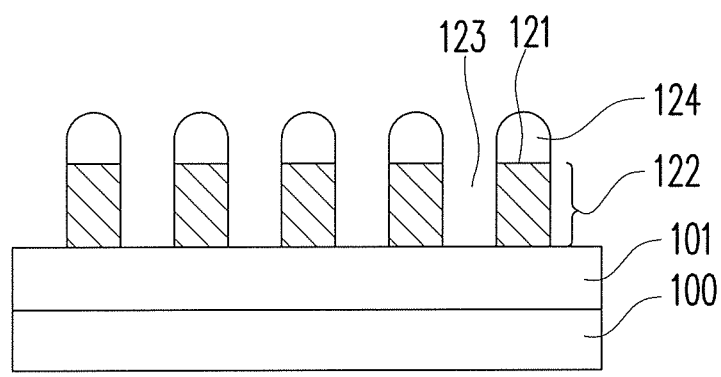

Referring to FIG. 1G, the target layer 102 is patterned, using the patterned first mask layer 124 as a mask, so as to form a patterned target layer 122 with a line/space width of about 50 nm/50 nm. The method of patterning the target layer 102 includes performing an etching process such as a dry etching process, for example. In an embodiment, the target layer 102 includes, from bottom to top, an aluminum layer with a thickness of about 1500 angstroms containing 0.5% copper, a titanium layer with a thickness of about 200 angstroms and a titanium nitride layer with a thickness of about 600 angstroms, for example. The parameters of the dry etching process include a pressure of about 5-15 mT, a top plate power of about 350-650 W, a bottom plate power of about 40-120 W, a $C_2$ flow rate of about 30-80 sccm, a $BCl_3$ flow rate of about 10-100 sccm, a $CHF_3$ flow rate of about 0-15 sccm, a $N_2$ flow rate of about 0-15 sccm and a period of about 50-70 seconds. The etching selectivity of the target layer 102 to the patterned first mask layer 124 is greater than 3, for example. In an embodiment, the etching selectivity of the target layer 102 (such as a TiN/Ti/Al layer) to the patterned first mask layer 124 (such as a silicon oxide layer) is about 3-8.

In the semiconductor structure of the present invention, the patterned target layer 122 with a line/space width of about 50 nm/50 nm is disposed on the substrate 100. In other words, the patterned target layer 122 has a plurality of patterns 121 and a plurality of openings 123 between the patterns 121, the width of each of the patterns 121 is about 50 angstroms, and the width of each of the openings 123 is about 50 angstroms. It is appreciated by persons skilled in the art that the line/space width of about 50 nm/50 nm is not limited by the present invention. The patterned target layer 122 with a line/space of less than 50 nm/50 nm can be fabricated by fine tuning the above-mentioned process parameters as needed.

The method in accordance with the present invention can be applied to not only the back-end metallization process to fabricate a metal line with a line/space width of less than 50 nm/50 nm, but also the front-end process if the process is controlled appropriately without any metal contamination between the front-end and the back-end. That is, the material of the target layer 102 may include polysilicon, polycide, metal silicide or the like.

The above-mentioned embodiment in which the first mask layer 104 is a silicon oxide layer, the second mask layer is a titanium nitride layer and the third mask layer is a silicon oxide layer is provided for illustration purposes, and is not to be construed as limiting the present invention. The material combinations of the first mask layer 104, the second layer 106 and the third mask layer 108 are varied as shown in Table 1. The etching gases for each material combination are listed below, and the other etching parameters such as pressure, top plate power, bottom plate power and etching period can be adjusted upon the process requirement. It is appreciated by persons skilled in the art that the material combinations are not limited by Table 1, other materials can be applied to the present invention as long as the etch selectivity between the third mask layer 108, the second mask layer 106, the first mask layer 104 and the target layer 102 meet the following requirement. That is, the etch selectivity of the second mask layer 106 to the third mask layer 108 is greater than about 5, the etch selectivity of the first mask layer 104 to the second mask layer 106 is greater than about 10, and the etch selectivity of the target layer 102 to the first mask layer 104 is greater than about 3

TABLE 1

| # | Materials of $3^{rd}$ mask layer/$2^{nd}$ mask layer/ $1^{st}$ mask layer | Patterning process of $3^{rd}$ mask layer (FIG. 1B) | Patterning process of $2^{nd}$ mask layer (FIG. 1E) | Patterning process of $1^{st}$ mask layer (FIG. 1F) |
|---|---|---|---|---|
| 1 | $SiO_2$/TiN/$SiO_2$ | Ar, $N_2$, $CHF_3$ | $Cl_2$, Ar | $CF_4$, $CHF_3$, $O_2$, Ar |
| 2 | $SiO_2$/Ti/$SiO_2$ | Ar, $N_2$, $CHF_3$ | $Cl_2$, Ar | $CF_4$, $CHF_3$, $O_2$, Ar |
| 3 | $SiO_2$/TaN/$SiO_2$ | Ar, $N_2$, $CHF_3$ | $Cl_2$, Ar | $CF_4$, $CHF_3$, $O_2$, Ar |
| 4 | $SiO_2$/Ta/$SiO_2$ | Ar, $N_2$, $CHF_3$ | $Cl_2$, Ar | $CF_4$, $CHF_3$, $O_2$, Ar |
| 5 | $SiO_2$/Poly/$SiO_2$ | $CF_4$, $CHF_3$, $O_2$ | HBr, $Cl_2$ | $CF_4$, $CHF_3$, $O_2$, Ar |
| 6 | $SiO_2$/TiN/SiN | Ar, $N_2$, $CHF_3$ | $Cl_2$, Ar | $CF_4$, $CHF_3$, $O_2$, Ar |
| 7 | $SiO_2$/Ti/SiN | Ar, $N_2$, $CHF_3$ | $Cl_2$, Ar | $CF_4$, $CHF_3$, $O_2$, Ar |
| 8 | $SiO_2$/TaN/SiN | Ar, $N_2$, $CHF_3$ | $Cl_2$, Ar | $CF_4$, $CHF_3$, $O_2$, Ar |
| 9 | $SiO_2$/Ta/SiN | Ar, $N_2$, $CHF_3$ | $Cl_2$, Ar | $CF_4$, $CHF_3$, $O_2$, Ar |
| 10 | $SiO_2$/Poly/SiN | $CF_4$, $CHF_3$, $O_2$ | HBr, $Cl_2$ | $CF_4$, $CHF_3$, $O_2$, Ar |
| 11 | $SiO_2$/TiN/SiON | Ar, $N_2$, $CHF_3$ | $Cl_2$, Ar | $CF_4$, $CHF_3$, $O_2$, Ar |
| 12 | $SiO_2$/Ti/SiON | Ar, $N_2$, $CHF_3$ | $Cl_2$, Ar | $CF_4$, $CHF_3$, $O_2$, Ar |
| 13 | $SiO_2$/TaN/SiON | Ar, $N_2$, $CHF_3$ | $Cl_2$, Ar | $CF_4$, $CHF_3$, $O_2$, Ar |
| 14 | $SiO_2$/Ta/SiON | Ar, $N_2$, $CHF_3$ | $Cl_2$, Ar | $CF_4$, $CHF_3$, $O_2$, Ar |
| 15 | $SiO_2$/Poly/SiON | $CF_4$, $CHF_3$, $O_2$ | HBr, $Cl_2$ | $CF_4$, $CHF_3$, $O_2$, Ar |
| 16 | SiON/TiN/$SiO_2$ | Ar, $N_2$, $CHF_3$ | $Cl_2$, Ar | $CF_4$, $CHF_3$, $O_2$, Ar |
| 17 | SiON/Ti/$SiO_2$ | Ar, $N_2$, $CHF_3$ | $Cl_2$, Ar | $CF_4$, $CHF_3$, $O_2$, Ar |
| 18 | SiON/TaN/$SiO_2$ | Ar, $N_2$, $CHF_3$ | $Cl_2$, Ar | $CF_4$, $CHF_3$, $O_2$, Ar |
| 19 | SiON/Ta/$SiO_2$ | Ar, $N_2$, $CHF_3$ | $Cl_2$, Ar | $CF_4$, $CHF_3$, $O_2$, Ar |
| 20 | SiON/Poly/$SiO_2$ | $CF_4$, $CHF_3$, $O_2$ | HBr, Cl2 | $CF_4$, $CHF_3$, $O_2$, Ar |
| 21 | SiON/TiN/SiN | Ar, $N_2$, $CHF_3$ | $Cl_2$, Ar | $CF_4$, $CHF_3$, $O_2$, Ar |
| 22 | SiON/Ti/SiN | Ar, $N_2$, $CHF_3$ | $Cl_2$, Ar | $CF_4$, $CHF_3$, $O_2$, Ar |
| 23 | SiON/TaN/SiN | Ar, $N_2$, $CHF_3$ | $Cl_2$, Ar | $CF_4$, $CHF_3$, $O_2$, Ar |
| 24 | SiON/Ta/SiN | Ar, $N_2$, $CHF_3$ | $Cl_2$, Ar | $CF_4$, $CHF_3$, $O_2$, Ar |
| 25 | SiON/Poly/SiN | Ar, $N_2$, $CHF_3$ | HBr, $Cl_2$ | $CF_4$, $CHF_3$, $O_2$, Ar |
| 26 | SiON/TiN/SiON | Ar, $N_2$, $CHF_3$ | $Cl_2$, Ar | $CF_4$, $CHF_3$, $O_2$, Ar |
| 27 | SiON/Ti/SiON | Ar, $N_2$, $CHF_3$ | $Cl_2$, Ar | $CF_4$, $CHF_3$, $O_2$, Ar |
| 28 | SiON/TaN/SiON | Ar, $N_2$, $CHF_3$ | $Cl_2$, Ar | $CF_4$, $CHF_3$, $O_2$, Ar |
| 29 | SiON/Ta/SiON | Ar, $N_2$, $CHF_3$ | $Cl_2$, Ar | $CF_4$, $CHF_3$, $O_2$, Ar |
| 30 | SiON/Poly/SiON | Ar, $N_2$, $CHF_3$ | HBr, $Cl_2$ | $CF_4$, $CHF_3$, $O_2$, Ar |
| 31 | SiN/TiN/$SiO_2$ | Ar, $N_2$, $CHF_3$ | $Cl_2$, Ar | $CF_4$, $CHF_3$, $O_2$, Ar |
| 32 | SiN/Ti/$SiO_2$ | Ar, $N_2$, $CHF_3$ | $Cl_2$, Ar | $CF_4$, $CHF_3$, $O_2$, Ar |
| 33 | SiN/TaN/$SiO_2$ | Ar, $N_2$, $CHF_3$ | $Cl_2$, Ar | $CF_4$, $CHF_3$, $O_2$, Ar |
| 34 | SiN/Ta/$SiO_2$ | Ar, $N_2$, $CHF_3$ | $Cl_2$, Ar | $CF_4$, $CHF_3$, $O_2$, Ar |
| 35 | SiN/Poly/$SiO_2$ | Ar, $N_2$, $CHF_3$ | HBr, $Cl_2$ | $CF_4$, $CHF_3$, $O_2$, Ar |
| 36 | SiN/TiN/SiN | Ar, $N_2$, $CHF_3$ | $Cl_2$, Ar | $CF_4$, $CHF_3$, $O_2$, Ar |
| 37 | SiN/Ti/SiN | Ar, $N_2$, $CHF_3$ | $Cl_2$, Ar | $CF_4$, $CHF_3$, $O_2$, Ar |
| 38 | SiN/TaN/SiN | Ar, $N_2$, $CHF_3$ | $Cl_2$, Ar | $CF_4$, $CHF_3$, $O_2$, Ar |
| 39 | SiN/Ta/SiN | Ar, $N_2$, $CHF_3$ | $Cl_2$, Ar | $CF_4$, $CHF_3$, $O_2$, Ar |
| 40 | SiN/Poly/SiN | $CF_4$, $CHF_3$, $O_2$ | HBr, $Cl_2$ | $CF_4$, $CHF_3$, $O_2$, Ar |
| 41 | SiN/TiN/SiON | Ar, $N_2$, $CHF_3$ | $Cl_2$, Ar | $CF_4$, $CHF_3$, $O_2$, Ar |
| 42 | SiN/Ti/SiON | Ar, $N_2$, $CHF_3$ | $Cl_2$, Ar | $CF_4$, $CHF_3$, $O_2$, Ar |
| 43 | SiN/TaN/SiON | Ar, $N_2$, $CHF_3$ | $Cl_2$, Ar | $CF_4$, $CHF_3$, $O_2$, Ar |
| 44 | SiN/Ta/SiON | Ar, $N_2$, $CHF_3$ | $Cl_2$, Ar | $CF_4$, $CHF_3$, $O_2$, Ar |
| 45 | SiN/Poly/SiON | $CF_4$, $CHF_3$, $O_2$ | HBr, $Cl_2$ | $CF_4$, $CHF_3$, $O_2$, Ar |

TABLE 1-continued

| # | Materials of 3$^{rd}$ mask layer/2$^{nd}$ mask layer/ 1$^{st}$ mask layer | Patterning process of 3$^{rd}$ mask layer (FIG. 1B) | Patterning process of 2$^{nd}$ mask layer (FIG. 1E) | Patterning process of 1$^{st}$ mask layer (FIG. 1F) |
|---|---|---|---|---|
| 46 | SiO$_2$/SiN/a-C | C$_4$F$_6$, CF$_4$, O$_2$ | CF$_4$, CH$_2$F$_2$, O$_2$ | Ar, O$_2$ |
| 47 | Poly/SiN/a-C | HBr, O2 | CF$_4$, CHF$_3$, O$_2$ | Ar, O$_2$ |
| 48 | SiO$_2$/Poly/a-C | CF$_4$, CHF$_3$, O$_2$ | HBr, Cl$_2$ | Ar, O$_2$ |
| 49 | SiON/Poly/a-C | CF$_4$, CHF$_3$, O$_2$ | HBr, Cl$_2$ | Ar, O$_2$ |
| 50 | SiN/Poly/a-C | CF$_4$, CHF$_3$, O$_2$ | HBr, Cl$_2$ | Ar, O$_2$ |

In the present invention, by adopting two patterned photoresist layers 112 and 116 having their respective patterns 113 and 117 alternately arranged and multiple hard mask layers 104, 106 and 108 including different materials, the patterned target layer 122 with a line/space width of less than 50 nm/50 nm can be formed by the existing machines and processes. In details, the patterned photoresist layer 112 with a certain pattern density transfers the trimmed patterns 113 thereof to the third mask layer 108 and then the second mask layer 106, and the patterned photoresist layer 116 with the same pattern density transfers the trimmed patterns 117 thereof to the second mask layer 106, so that the pattern density of the patterned second mask layer 126 is two times that of the patterned photoresist layer 112 or the patterned photoresist layer 116. Thereafter, the patterned second mask layer 126 with the double pattern density transfers the patterns thereof to the first mask layer 104 and then the target layer 102.

In summary, in the present invention, two times of a photolithography process with a certain pattern density and multiple pattern transfer processes with different hard masks are performed, so that the patterned target layer with the double pattern density is fabricated, and the purpose of reducing a line/space width to less than 50 nm/50 nm is achieved. Further, in the present invention, the critical dimension beyond the photolithography resolution can be easily fabricated with the existing machines and processes, so that the cost is greatly reduced and the competitiveness is significantly improved.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of forming a semiconductor structure, comprising:
    forming a target layer on a substrate;
    forming a multi-layer mask layer comprising a first mask layer and a second mask layer sequentially formed on the target layer, wherein the first mask layer comprises silicon nitride, and the second mask layer comprises titanium, titanium nitride, tantalum, or tantalum nitride;
    forming a first pattern transfer layer having a plurality of openings on the multi-layer mask layer;
    forming a second pattern transfer layer in the openings of the first pattern transfer layer;
    patterning the multi-layer mask layer, using the first pattern transfer layer and the second pattern transfer layer as a mask, so as to form a patterned multi-layer hardmask comprises a patterned first mask layer and a patterned second mask layer; and
    etching the target layer by the patterned multi-layer hardmask, wherein the patterned multi-layer hardmask comprises the patterned first mask layer and the patterned second mask layer,
    wherein an etch selectivity of the first mask layer to the second mask layer is greater than about 10, an etch selectivity of the second mask layer to the first pattern transfer layer is greater than about 5, and an etch selectivity of the target layer to the first mask layer is greater than about 3.

2. The method of claim 1, the step of forming the first pattern transfer layer on the multi-layer mask layer comprises:
    forming a third mask layer on the second mask layer;
    forming a bottom anti-reflection coating (BARC) layer on the third mask layer;
    forming a patterned photoresist layer on the third mask layer;
    sequentially patterning the BARC layer and the third mask layer, using the patterned photoresist layer as a mask, so as to form the first pattern transfer layer; and
    removing the BARC layer and the patterned photoresist layer.

3. The method of claim 2, further comprising performing a trimming process to the patterned photoresist layer before the step of sequentially patterning the BARC layer and the third mask layer, so as to reduce a line width of the patterned photoresist layer.

4. The method of claim 1, wherein the step of patterning the multi-layer mask layer comprises:
    patterning the second mask layer, using the first pattern transfer layer and the second pattern transfer layer as a mask, so as to form the patterned second mask layer; and
    patterning the first mask layer, using the patterned second mask layer as a mask, so as to form the patterned first mask layer.

5. The method of claim 1, wherein the first pattern transfer layer comprises silicon nitride.

6. The method of claim 1, wherein a thickness of the first mask layer is about 1000-2500 angstroms, a thickness of the second mask layer is about 150-500 angstroms, a thickness of the first pattern transfer layer is about 150-400 angstroms.

7. The method of claim 1, wherein the step of forming the second pattern transfer layer in the openings of the first pattern transfer layer comprises:
    forming a BARC layer to cover the first pattern transfer layer;
    forming a patterned photoresist layer on the BARC layer, wherein patterns of the patterned photoresist layer and patterns of the first pattern transfer layer are alternately arranged; and
    patterning the BARC layer, using the patterned photoresist layer as a mask, so as to form the second pattern transfer layer.

8. The method of claim 7, further comprising performing a trimming process to the patterned photoresist layer before the step of patterning the BARC layer, so as to reduce a line width of the patterned photoresist layer.

9. The method of claim 1, wherein the target layer is a conductive layer.

10. The method of claim 9, wherein the target layer comprises aluminum, tungsten, titanium, titanium nitride, polysilicon, polycide or metal silicide.

11. A method of forming a semiconductor structure, comprising:
   forming a target layer on a substrate;
   sequentially forming a first mask layer, a second mask layer and a first pattern transfer layer on the target layer, wherein the first mask layer comprises silicon nitride, and the first pattern transfer layer has a plurality of openings, and the second mask layer comprises titanium, titanium nitride, tantalum, or tantalum nitride;
   forming a second pattern transfer layer in the openings of the first pattern transfer layer;
   patterning the second mask layer, using the first pattern transfer layer and the second pattern transfer layer as a mask, so as to form a patterned second mask layer, wherein a first etch selectivity of the second mask layer to the first pattern transfer layer is greater than about 5;
   patterning the first mask layer, using the patterned second mask layer as a mask, so as to form a patterned first mask layer, wherein a second etch selectivity of the first mask layer to the patterned second mask layer is greater than about 10; and
   etching the target layer by a patterned multi-layer hardmask, wherein the patterned multi-layer hardmask comprises the patterned first mask layer and patterned second mask layer, and wherein a third etch selectivity of the target layer to the patterned first mask layer is greater than about 3.

12. The method of claim 11, wherein the step of forming the first pattern transfer layer on the second mask layer comprises:
   forming a third mask layer on the second mask layer;
   forming a BARC layer on the third mask layer;
   forming a patterned photoresist layer on the third mask layer;
   sequentially patterning the BARC layer and the third mask layer, using the patterned photoresist layer as a mask, so as to form the first pattern transfer layer; and
   removing the BARC layer and the patterned photoresist layer.

13. The method of claim 12, further comprising performing a trimming process to the patterned photoresist layer before the step of sequentially patterning the BARC layer and the third mask layer, so as to reduce a line width of the patterned photoresist layer.

14. The method of claim 11, wherein the step of forming the second pattern transfer layer in the openings of the first pattern transfer layer comprises:
   forming a BARC layer to cover the first pattern transfer layer;
   forming a patterned photoresist layer on the BARC layer, wherein patterns of the patterned photoresist layer and patterns of the first pattern transfer layer are alternately arranged; and
   patterning the BARC layer, using the patterned photoresist layer as a mask, so as to form the second pattern transfer layer.

15. The method of claim 14, further comprising performing a trimming process to the patterned photoresist layer before the step of patterning the BARC layer, so as to reduce a line width of the patterned photoresist layer.

16. The method of claim 11, wherein the first pattern transfer layer comprises silicon nitride.

17. The method of claim 11, wherein the target layer is a conductive layer.

18. The method of claim 17, wherein the target layer comprises aluminum, tungsten, titanium, titanium nitride, polysilicon, polycide or metal silicide.

* * * * *